United States Patent [19]

Ogawa

[11] Patent Number: 4,716,290
[45] Date of Patent: Dec. 29, 1987

[54] ROTARY ENCODER WITH INTERMITTENT FEED MEANS

[75] Inventor: Yoshiaki Ogawa, Kamakura, Japan

[73] Assignee: Nippon Gear Co., Ltd., Fujisawa, Japan

[21] Appl. No.: 668,751

[22] Filed: Nov. 6, 1984

[30] Foreign Application Priority Data

Nov. 29, 1983 [JP] Japan ................ 58-223128

[51] Int. Cl.⁴ .............................. G01D 5/38
[52] U.S. Cl. .................. 250/231 SE; 250/237 G; 340/347 P; 74/435; 74/436
[58] Field of Search ................ 74/435, 436; 250/231 SE, 237 G; 340/870.29, 347 P

[56] References Cited

U.S. PATENT DOCUMENTS

| | | | |
|---|---|---|---|
| 2,605,647 | 8/1952 | Duvoisin | 74/436 |
| 2,881,630 | 4/1959 | Opocensky | 74/435 |
| 3,846,788 | 11/1974 | Calabro et al. | 340/870.29 |
| 4,037,219 | 7/1977 | Lewis | 340/870.29 |
| 4,124,839 | 11/1978 | Cohen | 340/870.29 |
| 4,137,451 | 1/1979 | Einolf, Jr. | 340/347 P |
| 4,511,798 | 4/1985 | Killingsworth | 340/870.29 |
| 4,536,762 | 8/1985 | Moates | 250/231 SE |

OTHER PUBLICATIONS

"Control Engineers' Handbook", John G. Tuxal, Editor 1965, pp. 5-64.
Tamagawa Seiki Co., Ltd "Encoders" Catalog.

Primary Examiner—Edward P. Westin
Assistant Examiner—Charles F. Wieland
Attorney, Agent, or Firm—Hayes, Davis & Soloway

[57] ABSTRACT

A rotary encoder includes a train of gears meshed together in a multi-stage so as to reduce the driving number successively and encoders provided with the gear shafts in desired stages in order to count the number of revolutions of a power input shaft. The driving wheel and its corresponding driven wheel between desired two stages of the train of the gears are formed into such intermittent feed means as permitting idling of the driving wheel by cutting off suitable parts of the meshing portion of at least either one of the driving wheel and driven wheel in accordance with the reduction ratio required in driving number between the desired two stages. The present invention can thus provide economical and highly-accurate rotary encoders of the absolute type, which has a wide counterable range, without need for especially-high accuracy with respect to their designing accuracy, the machining accuracy of their gears, assembling accuracy and the like.

9 Claims, 10 Drawing Figures

ROTARY ENCODER WITH INTERMITTENT FEED MEANS

BACKGROUND OF THE INVENTION (1) Field of the Invention

This invention relates to a rotary encoder capable of measuring, as a digital absolute magnitude, the number of revolutions of an operation-controlling rotary shaft in an automatic control apparatus, robot apparatus, manipulator apparatus or the like, a power-transmitting rotary shaft used for feeding a material or for opening and closing a valve or the like.

(2) Description of the Prior Art

Increment-type (or relative-type) instruments and absolute-type instruments have heretofore been employed to measure digitally the number of revolutions of a controlling or power-transmitting rotary shaft. The term "number of revolutions" as used herein may also be called "the driving number" but will hereinafter be used to mean the number of actual revolutions in order to avoid its confusion with the number of revolutions per unit time.

Increment-type instruments have simple structures and can thus be used economically. They have hence found wide-spread commercial utility in various control apparatus and systems.

However, increment-type instruments are accompanied by such drawbacks that they require initial presetting such as adjustment to original points, and because necessary data are lost when their power sources are cut off, automatic control systems are actuated erroneously and may induce accidents even when their power sources are momentarily cut off.

Among absolute-type instruments, there are potentiometers, encoders making use of encoder plates, gear devices, etc.

Absolute-type instruments relying upon potentiometers are of the analog system. In order to obtain digital signals, it is necessary to subject each measurement result to an analog/digital conversion. Besides, they are susceptible to influence such as drift. In addition, the numbers of revolutions which may be input to such instruments are limited to about 10 revolutions or so. Unless reduced by means of a train of gears, such potentiometer-relying instruments cannot be used to measure relatively-higher numbers of revolutions.

On the other hand, absolute-type instruments each of which is equipped with an encoder, which is in turn constructed of a single piece of encoder plate, so as to obtain many bits can be applied only where the number of revolutions to be input is one revolution or less. Their resolutions are also limited. Therefore, it is not likely to obtain any high-digit output from such instruments.

As instruments capable of solving the above-mentioned drawbacks, there have been proposed instruments each of which makes combined use of a train of gears and an encoder employing an encoder plate capable of obtaining many bits at the same time.

In each of such newly-proposed instruments, the number of input revolutions is successively reduced at constant ratios by means of a train of gears. With respect to each stage of the thus-reduced train of gears, the angle of each rotation is encoded by means of an encoder which is able to obtain a plurality of bits.

In the above case, the resolutions of encoders which resolutions are required for the respective stages vary depending on their respective reduction ratios relative to the number of input revolutions.

Let's now assume by way of example that the reduction ratio per each stage be 1/10. Where a train of gears consists of three stages meshed with one another, the angles of rotations are respectively 36 degree in the first stage, 3.6 degree in the second stage and 0.36 degree in the third stage. Therefore, such instruments are accompanied by a drawback that an extremely high level of accuracy is required for the highest stages.

Even if a high level of accuracy should be achieved for the highest encoder, a train of gears having usual machining accuracy cannot avoid errors which occur when the direction of revolutions is reversed, for example, due to backlash or the like.

The adverse effect of such backlash is directly conveyed to the highest stage. The backlash is accumulated as gears are meshed in a higher stage, and the thus-accumulated backlash is reflected to the highest digit. Therefore, even if the accuracy of each encoder is improved, the upper value of practically-countable revolutions is limited by mechanical inaccuracy such as backlash and the like so long as a train of gears is employed.

The adverse effect of backlash arises as a hysteresis phenomenon of each rotary encoder when the direction of its revolution has been reversed. If such an adverse effect occurs either before or after a carry, it will come out more seriously as an error in the upper digit. This is another drawback of the above-proposed instruments.

Moreover, mechanical inaccuracy such as backlash and the like increases by wearing, abrasion or the like of the train of gears. Therefore, it is infeasible to expect stability and reliability over a long period of time.

SUMMARY OF THE INVENTION

An object of this invention is to solve the above-mentioned drawbacks, especially to keep the resolution levels required for encoders at a constant level irrespective to the places of digits, to facilitate the meshing of gears in a multi-stage, and hence to enlarge the counterable range and to permit a reduction to the accuracy of mechanical machining while still using an absolute-type instrument making use of a train of gears.

In one aspect of this invention, there is thus provided a rotary encoder including a train of gears meshed together in a multi-stage so as to reduce the driving number successively and encoders provided with the gear shafts in desired stages in order to count the number of revolutions of a power input shaft, wherein the driving wheel and its corresponding driven wheel between desired two stages of the train of the gears are formed into such intermittent feed means as permitting idling of the driving wheel by cutting off suitable parts of the meshing portion of at least either one of the driving wheel and driven wheel in accordance with the reduction ratio required in driving number between the desired two stages.

The present invention can thus provide economical and highly-accurate rotary encoders of the absolute type, which has a wide counterable range, without need for especially-high accuracy with respect to their designing accuracy, the machining accuracy of their gears, assembling accuracy and the like.

They are durable and do not require high accuracy with respect to their mechanisms owing to their simple structures. Therefore, their measurement accuracy will not be reduced by changes which may be developed along the passage of time, for example, wearing, abrasion or the like. Hence, the present invention can provide rotary encoders having high long-term stability and high reliability.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENTS

Figure 1:
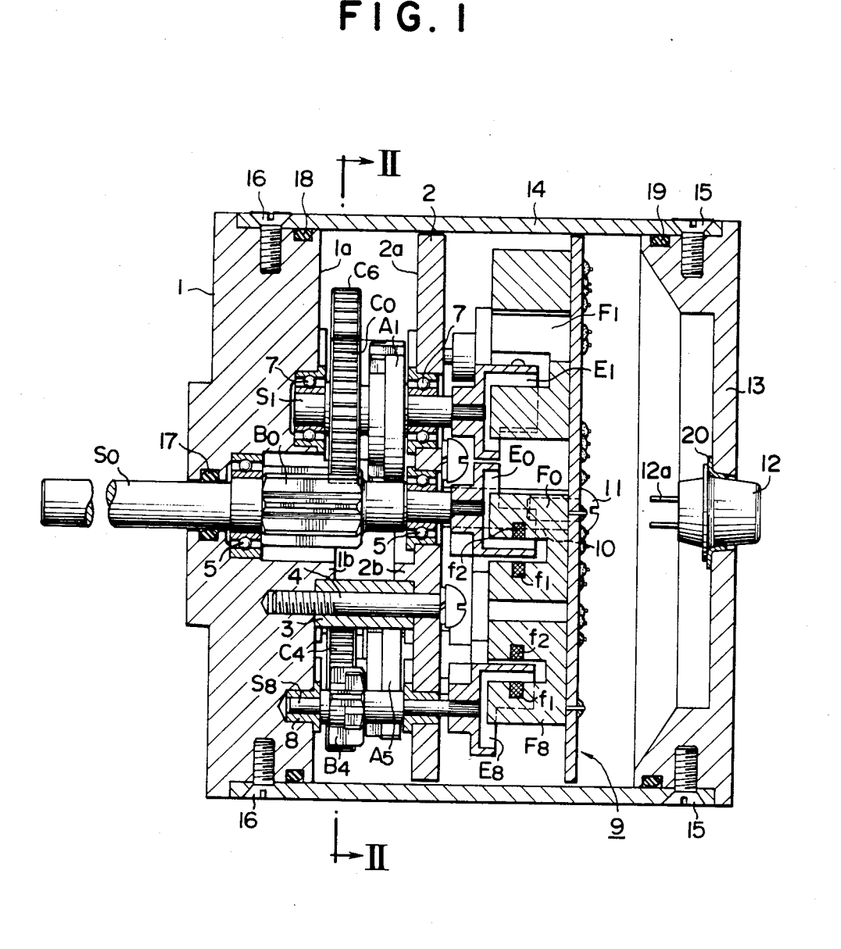
FIG. 1 is a central, longitudinal, cross-sectional elevation of a rotary encoder according to the first embodiment of this invention.
Figure 2:
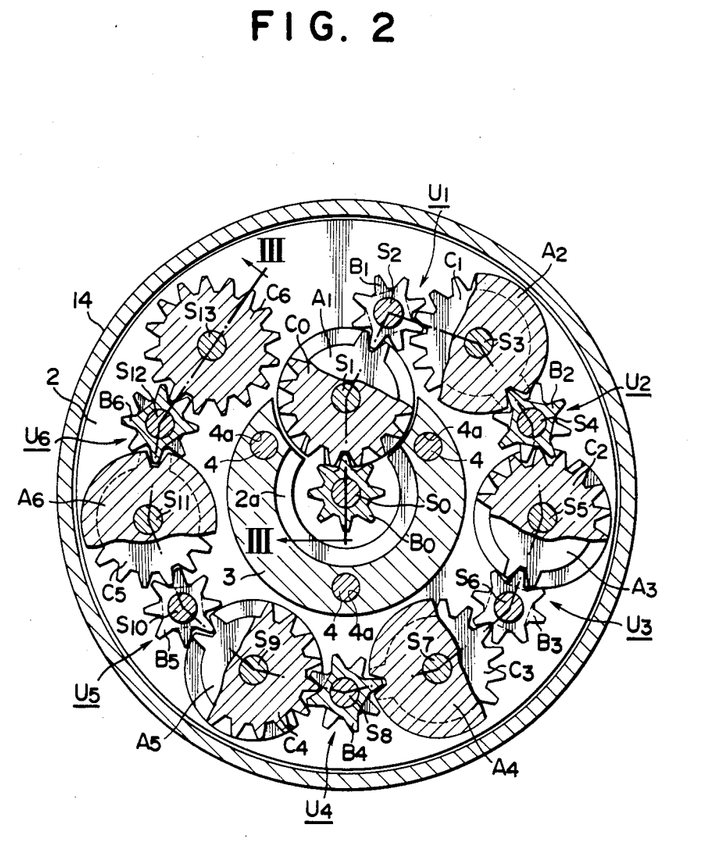
FIG. 2 is a transverse cross-sectional view taken along line II—II of FIG. 1.

FIG. 1 is a central, longitudinal, cross-sectional view of a rotary encoder according to the one embodiment of this invention. FIG. 2 is a cross-sectional view taken along line II—II of FIG. 1, in which parts of gears have been cut off.

Numeral 1 illustrates a disk-shaped base having a large thickness in the longitudinal direction of the rotary encoder. Designated at numeral 2 is a disk-shaped bearing support arranged in parallel with the rear surface of the base 1, namely, an inner wall 1a with some spacing therebetween.

The bearing-support 2 is fixedly attached to the base 1 by means of three fixing screws 4, while maintaining the constant interval from the base 1 owing to the interposition of a spacer 3 of a cylindrical shape the side wall of which is partially cut off.

The spacer 3 is fit at its outer and inner side surfaces respectively over convex shoulders 1b and 2b which are formed respectively on the inner wall 1b of the base 1 and the outer surface 2b of the bearing support 2, said inner wall 1b and outer surface 2b extending in a fact-to-face relation with each other, so that the spacer 3 is coaxially registered with the base 1 and bearing support 2.

The spacer 3 is radially somewhat thick. Longitudinal holes 4a are formed through the spacer, through which the three fixing screws 4 extend respectively.

A power input shaft $S_0$ is provided longitudinally and centrally through the base 1 and bearing support 2. The power input shaft $S_0$ is rotatably supported by ball bearings 5,5 fit centrally in the inner wall 1a of the base 1 and the bearing support 2.

The power input shaft $S_0$ is provided between the ball bearings 5,5 with a pinion $B_0$ having 8 teeth.

The outer diameter of the spacer 3 is significantly smaller than the outer diameter of the base 1. Thus, a toroidal gear compartment 6 is formed by a casing 14, the inner wall 1a of the base 1, the outer wall of the bearing support 2 and the circumferential wall of the spacer 3. In this gear compartment 6, there is housed a train of many gears meshed with one another.

A gear shaft $S_1$ of the first stage, which is kept in meshing engagement with the pinion $B_0$ on the power input shaft $S_0$, is provided in a cut-off part 3a of the spacer 3. Both end portions of the gear shaft $S_1$ are rotatably supported by ball bearings 7,7 which are fit respectively in the base 1 and bearing support 2.

A gear shaft $S_2$ of the second stage is provided outwardly in the radiation direction, with a predetermined interval from the gear shaft $S_1$ of the first stage. Gear shafts $S_2$ to $S_{13}$ of the second to thirteen stages are arranged in a circular pattern with a constant interval in the circumferential direction within the toroidal gear compartment 6. Both end portions of each of the gear shafts $S_2$ to $S_{13}$ are rotatably supported by their corresponding metal bearings 8 fit in the base 1 and bearing support 2.

Figure 3:
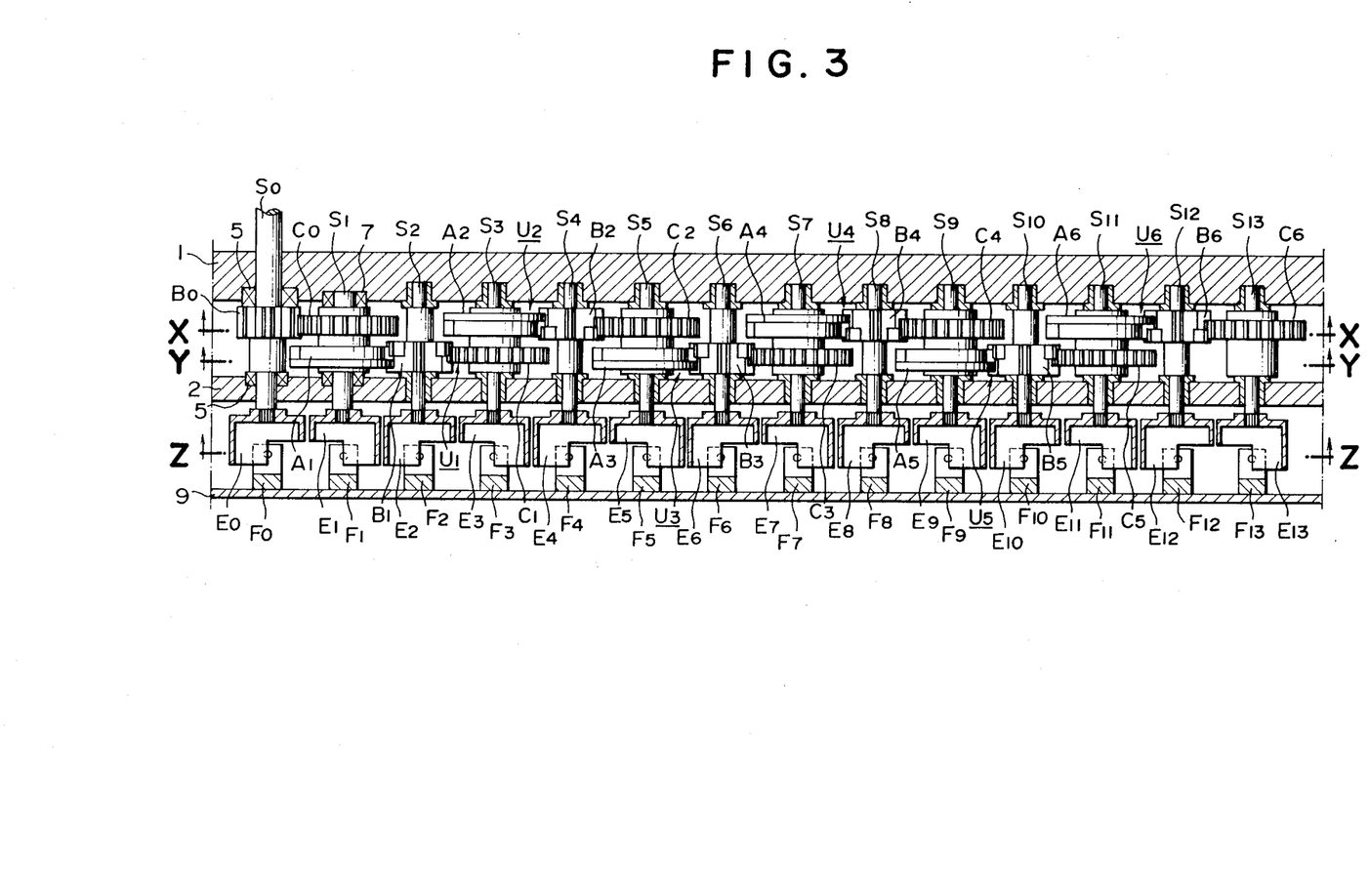
FIG. 3 is a cross-sectional view taken along line III—III of FIG. 2, in which the spacings between gear shafts have been developed.
Figure 4:
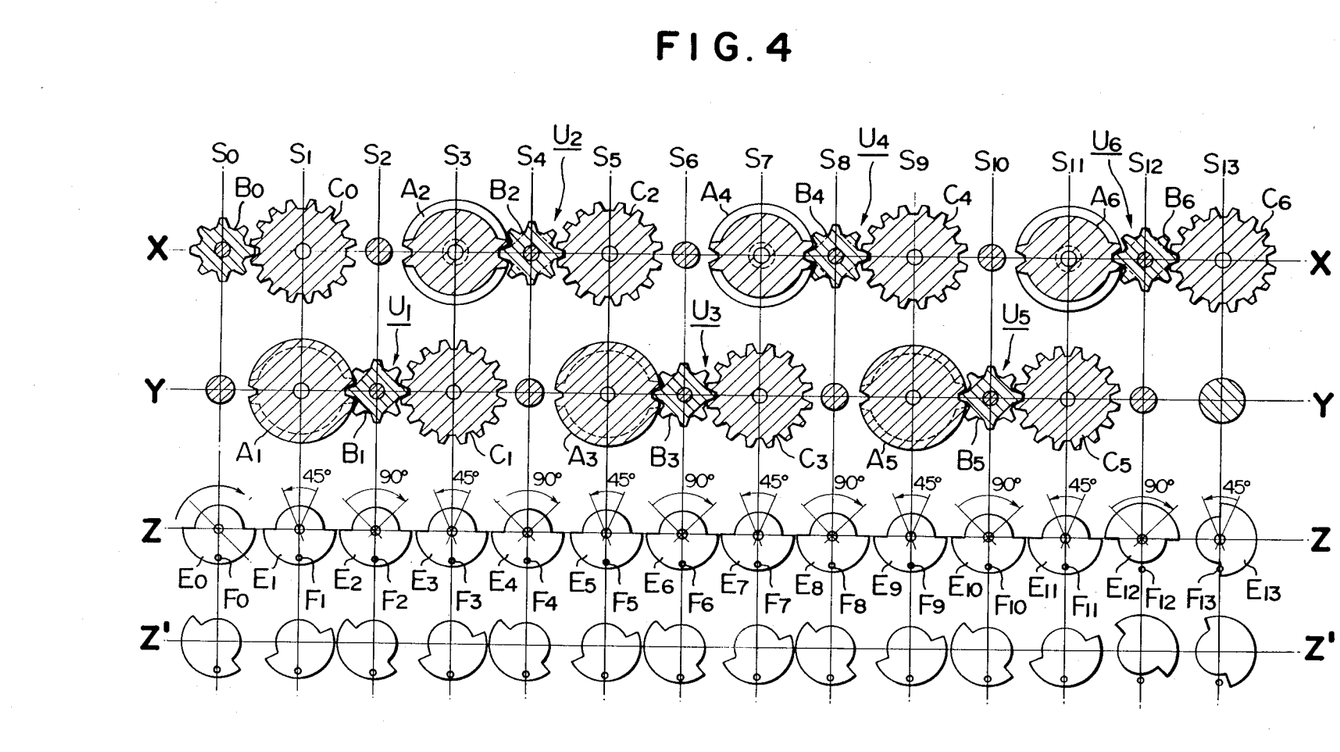
FIG. 4 is a cross-sectional view of the gear arrangement of FIG. 3, in which the gears and gear shafts have been cross-sectioned along lines X—X, Y—Y and Z—Z and arranged on the axes of their respective gear shafts.
Figure 5:
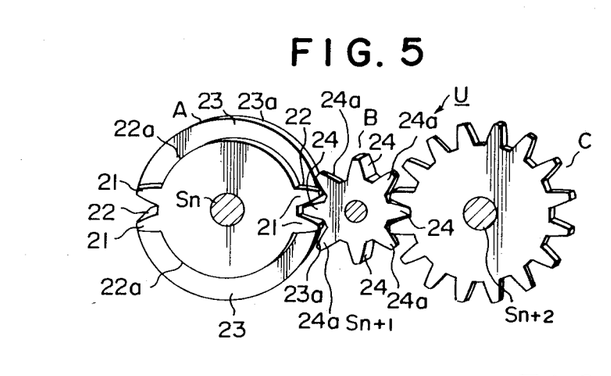
FIG. 5 is a perspective view showing the structure of a gear unit U.

Each of the gear shafts $S_1$ to $S_{13}$ carries gears A, B and C of its corresponding gear unit U, such as those shown in FIG. 5, in a manner illustrated in FIGS. 3 and 4.

In the subsequent description and the accompanying drawings, the gear units provided respectively with the gear shafts $S_1$ to $S_{13}$ will be designated by writing subscripts of their unit numbers, namely, as gear units $U_1$ to $U_6$. On the other hand, the constituent gears A, B and C in each gear unit U will be designated in the same manner.

The gear unit U shown in FIG. 5 is composed of a driving wheel A adapted to intermittently and successively drive gear shafts $S_{n+1}$ and $S_{n+2}$ of the upper stages on the basis of each revolution of a drive shaft $S_n$ of the lower stage, a first driven wheel B driven intermittently by the driving wheel A and suitably locked and restrained from revolution while the driving wheel A is idling, and a second driven wheel C to which each revolution of the first driven wheel B is transmitted with a reduction ratio of ½.

The driving wheel A has been formed by providing a spur gear having 16 teeth, and removing all the teeth but mutually-adjacent two teeth 21,21 and another mutually-adjacent two teeth 21,21 which are diametrically opposite to the former two teeth 21,21. The parts extending between the opposing teeth 21,21 are left as arcuate portions 22a having a radius equal to the radius of a slot 22 defined by either the former or latter two teeth 21,21. Behind the arcuate portions 22a, arcuate ribs 23 having a radius equal to the height of the teeth 21 are provided closely.

The first driven wheel B has been formed by recessing a portion of the rear wall thickness of every second teeth 24a of a pinion, which had 8 teeth, to a thickness of about one-half of their original thickness.

The second driven wheel C is a spur gear having 16 teeth similar to the original driving wheel A before the removal of its teeth.

The eight teeth of the first driven wheel B are kept in meshing engagement with the teeth 21 left in pairs in the front face of the driving wheel A, whereas the rear parts of the four thick teeth 24 of the driven wheel B lie in the same plane as the ribs 23 of the driving wheel A.

Accordingly, the driving wheel A can drive by means of two sets of the mutually-adjacent two teeth 21 the first driven wheel B through an angle of 45 degree only per every 180 degree. Through the revolution range of 135 degree, no revolution is transmitted from the driving wheel A to the driven wheel B.

In the course of the above-mentioned range in which the revolution of the driving wheel A is not transmitted, the rear parts of mutually-adjacent two teeth of the four thick teeth 24 left on the first driven wheel B undergo sliding motion while kept in contact with the circumferential face of either one of the ribs 23.

Namely, in the above-mentioned state of contact, the facing walls of the rear parts of the adjacent two teeth 24,24 of the first driven wheel B are kept in contact with the circumferential surface of the rib 23, namely, an arcuate wall 23a. Thus, the driving wheel A is freely rotatable relative to the first driven wheel B. However, the first driven wheel B can rotate neither in the normal direction nor in the reverse direction relative to the driving wheel A, because the facing walls of the adjacent teeth 24,24 are in contact with the circumferential wall of the rib 23.

The eight teeth of the first driven wheel B are brought into meshing engagement with the second driven wheel C. Whenever the first driven wheel B is intermittently driven through an angle of 90 degree, the second driven wheel C is intermitenly driven through an angle reduced to 45 degree.

As described above, each full revolution of the driving wheel A causes the first driven wheel B to turn intermittently twice, each through an angle of 90 degree, through a total angle of 180 degree, in other words, to make a half turn, and the second driven wheel C to turn intermittently twice, each through an angle of 45 degree, through a total angle of 90 degree, in other words, to make a ¼ turn.

Here, the rotary angle in each intermittent feeding of the driving wheel A is 45 degree. During this driving, the rotation through the angle of 45 degree results in a speed-increasing drive, whereby causing the first driven wheel B to turn through an angle of 90 degree. Since the first driven wheel B effects a speed-decreasing drive, namely, each rotation of the first driven wheel B through an angle of 90 degree makes the second driven wheel C turn through an angle of 45 degree, the speed ratio to be achieved when the second driven wheel C is driven by the driving wheel A will be a synchromeshing drive of 1:1.

When the gear units of many stages are successively connected in such a manner that the gear shaft of the second driven wheel C is meshed with the driving wheel A of the gear unit U of the subsequent stage, the speed ratios of the respective gears and their shafts are reduced successively to ½ while the revolution speed ratios of gear shafts, each equipped with the driving wheel A and second driven wheel C, become equal to one another.

In the embodiment depicted in FIGS. 1 and 2, six sets of gear units $U_1$–$U_6$ are successively mounted in a multi-stage on the gear shafts $S_1$–$S_{13}$ as described above.

Incidentally, the gear shaft $S_1$ of the first stage is provided with a spur gear $C_0$ having 16 teeth similar to the second driven wheel C of the gear unit U. The pinion $B_0$ on the power input shaft $S_0$, which pinion is kept in meshing engagement with the gear $C_0$, corresponds to the portion of the eight teeth of the second driven wheel B in the gear unit U.

In FIG. 3, the gear shafts $S_0$–$S_{13}$ which are arranged in a circular pattern in FIG. 2 are cross-sectioned along line III—III and developed along a straight line so that the axes of the gear shafts $S_0$–$S_{13}$ lie thereon. FIG. 3 shows clearly the manner of meshing of the gear units $U_1$–$U_6$ in the multi-stage and their relationship with one-bit encoders provided respectively behind the gear units.

The one-bit encoders are respectively composed in combination of encoder plates $E_0$–$E_{13}$ and photocouplers $F_0$–$F_{13}$.

The gear shafts $S_0$–$S_{13}$ extend rearwardly through the bearing support 2. The encoder plates $E_0$–$E_{13}$ are fixedly mounted on rear end portions of the gear shafts $S_0$–$S_{13}$.

The encoder plates $E_0$–$E_{13}$ are top-closed circular cylinders with their cylindrical openings directed rearwards and their top walls fixed to the rear ends of the gear shafts $S_0$–$S_{13}$. The side walls of the cylindrical encoder plates $E_0$–$E_{13}$ are cut off semicylindrically to suitable depths from their open ends.

Behind the encoder plates $E_0$–$E_{13}$, there are respectively provided photocouplers $F_0$–$F_{13}$ fixed by soldering their electrically-connecting leads to a printed circuit board 9.

The photocouplers $F_0$–$F_{13}$ are provided in such a way that the remaining half side walls of the cylindrical portions of the encoder plates $E_0$–$E_{13}$ pass between photoelectric transducers $f_1,f_2$ of their corresponding photocouplers $F_0$–$F_{13}$ so as to detect the remaining half side walls by the photoelectric transducers.

The printed circuit board 9 is fixed on the bearing support 2 by means of two supports 10 and a screw 11 so that the front surface of the printed circuit board 9 is kept apart with a constant interval from the bearing support 2.

Electrical leads of the photocouplers $F_0$–$F_{13}$ on the printed circuit boards 9 are connected a terminal 12a of a connector 12 by way of a flexible cable, illustration of which is omitted in the drawings.

The connector 12 is fixed substantially centrally on a disk-shaped lid 13, the circumference of which is fit in the rear end of the cylindrical casing 14. The lid 13 is fixed to the casing 14 by flush screws 15.

The base 1 is internally fit in the front end of the casing 14. The base 1 and casing 14 are fixed to each other by flush screws 16.

Incidentally, numerals 17,18,19,20 indicate moisture-proof, water-proof and explosion-proof packings, respectively.

FIG. 4 shows the cross-sections of the gears and gear shafts along the lines X—X, Y—Y and Z—Z of FIG. 3, in which the gears are respectively arranged on the axes of their corresponding gear shafts $S_0$–$S_{13}$.

In FIG. 4, the encoder plates $E_0$–$E_{13}$ are schematically illustrated for the sake of convenience by showing their cylindrical portions, which contain cut-out parts, as two-dimensionally developed fan shapes. On the other hand, the photoelectrical connections of the photocouplers $F_0$–$F_{13}$ are indicated by circles.

In FIGS. 2, 3 and 4, the gears are all meshed in driving state so as to drive the gear shaft $S_{13}$ of the highest digit.

The positions of the encoder plates $E_0$–$E_{13}$ upon completion of their motions subsequent to the above driving state are shown on the line $Z'$—$Z'$ in FIG. 4.

The gear units $U_1$–$U_6$ cause the first driven wheels $B_1$–$B_6$ to rotate intermittently twice, each through an angle of 90 degree, through a total angle of 180 degree per every single full revolution of the driving wheels $A_1$–$A_6$. At the same time, the driving wheels $A_1$–$A_6$ cause the second driven wheels $C_1$–$C_2$ to rotate twice, each through an angle of 45 degree, through a total angle of 90 degree.

As illustrated in FIG. 4, when all the gears are brought into meshing engagement and are driven by the power input shaft $S_0$, the shafts are connected in such a way that their rotary speeds are ½ gear down, 2 times gear up, ½ gear down, ... relative to their preceding shafts successively from the shaft $S_1$.

As described above, the mutually corresponding gears $A_1$–$A_6$, $B_1$–$B_6$ and $C_1$–$C_6$ in the gear units $U_1$–$U_6$ rotate respectively at the same speeds. The pinion gear $B_0$ of the power input shaft $S_0$ corresponds to the gears $B_1$–$B_6$ while the gear $C_0$ which is kept in meshing engagement with the pinion gear $B_0$ corresponds to the gears $C_1$–$C_6$.

As mentioned above, the gears $A_2$–$A_6$ equivalent to the driving wheel A of the gear unit U and the gears $C_1$–$C_5$ equivalent to the second driven wheel C are fixedly mounted successively on the common gear shafts $S_2$, $S_3$, ..., $S_n$ in such combinations as the gears $A_2$ and $C_1$, the gears $A_3$ and $C_2$, ... the gears $A_6$ and $C_5$. Therefore, they rotate obviously at the same speed.

FIG. 4 shows the relative positional relationship between the encoder plates $E_0$–$E_{13}$ and the photocouplers $F_0$–$F_{13}$ in the above driving period.

The encoder plates $E_0$–$E_{13}$ are of a cut-off structure so as to obtain Gray binary codes. According to such Gray binary codes, all the gears are meshed together when the highest 13th digit is carried up.

The phases of the encoder plates $E_0$–$E_{13}$ shown on the line $Z'$—$Z'$ in FIG. 4 are immediately after the above carry has been completed, the feeding of the gears has been stopped, and the bits have occurred at the highest positions in their stable state.

An unstable period in which the encoder plates $E_0$–$E_{13}$ are rotating or are serving as encoders corresponds always to a constant angle, i.e., 90 degree in terms of the rotary angle of the power input shaft $S_0$ when seen from the shaft for any digit. This rotary angle of 90 degree is equivalent only to ¼ quantized unit when one full input revolution is expressed as one quantized unit (1 digit).

Furthermore, the resolution of each of the encoders composed respectively of the encoder plates $E_0$–$E_{13}$ and the photocouplers $F_0$–$F_{13}$ may be divided to the resolution pertaining to the first driven wheel B of the gear unit U and that relating to the second driven wheel C (or the driving wheel A). Since the intermittent stepwise feed angles of the first driven wheel B and second driven wheel C are respectively 90 degree and 45 degree, the resolution of the encoder is limited at 45 degree by the driven wheel C in the worst case.

However, the resolution of 45 degree in the worst case remains always constant absolutely irrelevant to the number of digits and the places of the digits in the present embodiment. Furthermore, this worst case of 45 degree is such a low resolution that was not permitted for conventional encoders and permits enough tolerance to facilitate the fabrication of encoders.

Figure 6:
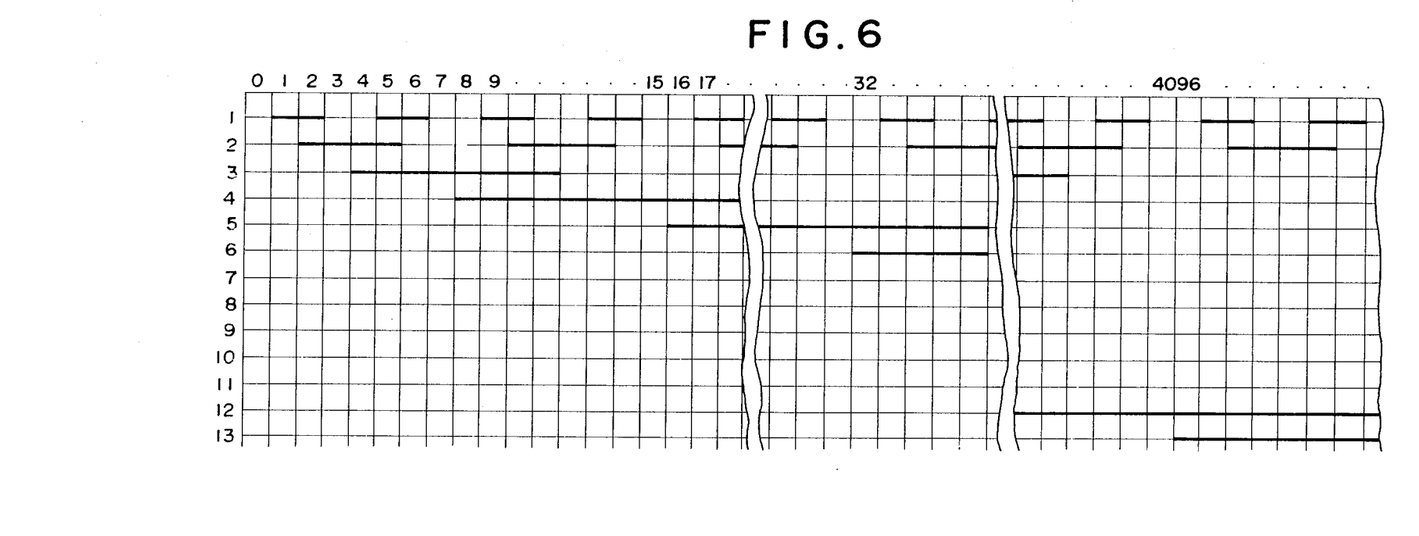
FIG. 6 is a timing chart of a Gray binary code obtained in accordance with this invention.
Figure 7:
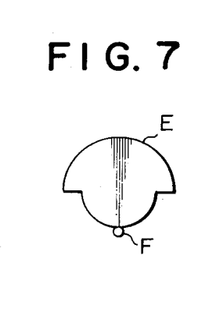
FIG. 7 is a schematic illustration of an encoder plate for obtaining the Gray binary code.

The Gray binary code has such a bit pattern that, as illustrated in the timing chart in FIG. 6, a bit change in each digit occurs whenever 2 is counted in the particular digit. Thus, each of the encoder plates $E_0$–$E_{13}$ has been formed by cutting off one-half of its cylindrical side wall as schematically depicted in FIG. 7 so that it can count 90 degrees twice, taking 90 degrees as a quantized unit, and can thus produce a change in the output of its corresponding one of the photocouplers $F_0$–$F_{13}$ at every 180 degree.

Figure 8:
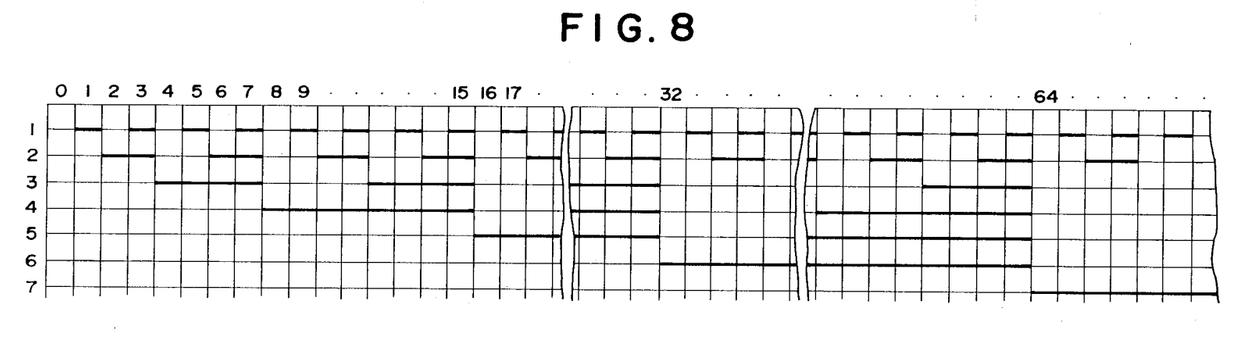
FIG. 8 is a timing chart of an ordinary binary code.
Figure 9:
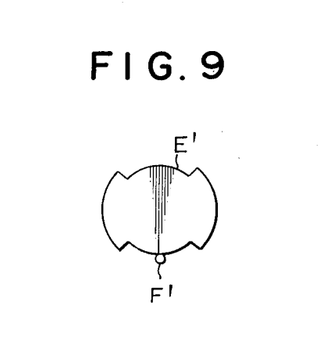
FIG. 9 is a schematic illustration of an encoder plate for obtaining the binary code in FIG. 7.

FIG. 8 shows the timing chart of an ordinary binary code. In order to obtain such a bit pattern as shown there, it is necessary to form the encoder plates into such as shape as an encoder plate E' illustrated schematically in FIG. 9. The encoder plate E' has cut-off parts at every 90 degrees.

When the encoder plates $F_0$–$F_{13}$ are in their initial state under the Gray binary code, for example, when the count number is 0, the encoder plates $E_{12}$–$E_{13}$ corresponding to the highest two digits are registered with phases similar to those of the encoder plates $E_0$–$E_{13}$ other than those corresponding to the highest two digits, which encoder plates $E_0$–$E_{13}$ are shown respectively on the line $Z'$—$Z'$ in FIG. 4.

As apparent from FIG. 6, the Gray binary code is right before proceeding to the step next to a step to which the immediately lower digit has been carried up in the timing immediately before effecting the carry which will develop a change in state in the upper digit. All digits lower than the above-mentioned digit are of timing immediately before proceeding to the initial state.

Therefore, with respect to the encoder plates $E_0$–$E_{13}$ on the line $Z'$—$Z'$ in which the gear shaft $S_{13}$ corresponding to the highest digit has completed a carry, the encoder plates $E_0$–$E_{12}$ corresponding to lower digits other than the highest two digits are said to show the initial state.

Needless to say, the rotary phases of the encoder plates $E_0$–$E_{13}$ are determined in accordance with the relationship between their cut-off parts and the photoelectric transducers $f_1, f_2$ of the photocouplers $F_0$–$F_{13}$.

The description has been made principally on the basis of FIGS. 3 and 4. In the specific embodiment depicted in FIGS. 1 and 2, the gear shafts $S_0$–$S_{13}$ are not arranged along a straight line but are arranged in a circular pattern.

Therefore, it is necessary to provide suitable offset angles for the meshing of the gear units $U_1$–$U_6$.

When driving, for example, the gear shaft $S_{13}$ corresponding to the highest digit, it is desirable that all gears are meshed simultaneously in the same phase as illustrated in FIG. 4.

However, the gears are arranged in such a way that they occupy space as small as possible and are all enclosed in the gear compartment 6. Therefore, the arrangement of the gear shafts $S_0$–$S_{13}$ is not linear but is bent into a circular pattern.

When mounting the driving wheels A and the second driven wheels C on their respective gear shafts upon connection of the gear units $U_1$–$U_6$, the offset angle $\theta$ between each driving wheel A and its corresponding driven wheel C is set equal to the angle made at a shaft $S_n$ by the line connecting the center of a shaft $S_n$ with the center of its corresponding lowest shaft $S_{n-1}$ and that connecting the center of the shaft $S_n$ and the center of its corresponding highest shaft $S_{n+1}$.

In the above-described first embodiment of this invention, a suitable number of teeth are removed from a spur gear to make the intermittent feed means. Similar operational effects may also be achieved using a Maltase gear mechanism.

Figure 10:
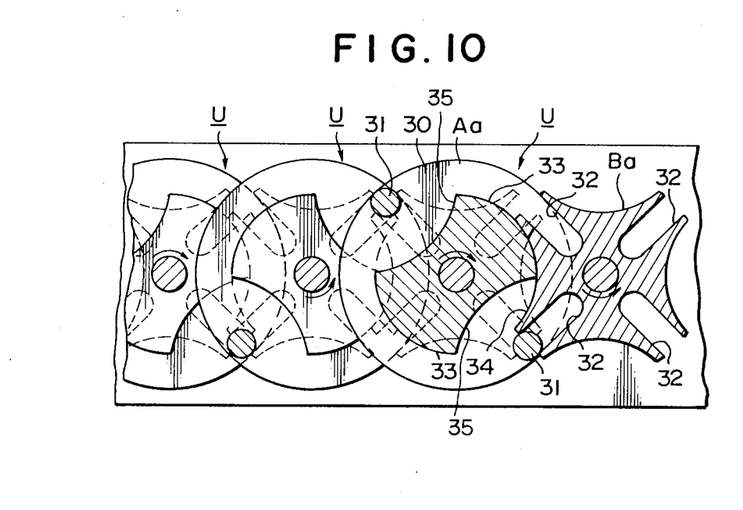
FIG. 10 is a longitudinal cross-sectional view of a Maltase gear structure of intermittent feed means of a rotary encoder according to the second embodiment of this invention.

FIG. 10 illustrates the second embodiment of this invention, which makes use of such a Maltase gear mechanism. In the illustrated embodiment, the intermittent feed gear mechanisms of some stages are only shown.

A Maltase gear unit $U_a$ is composed of a driving wheel $A_a$ having two axially-extending meshing pins 31 disposed diametrically opposite to each other and a driven wheel $B_a$ defining with an angular interval of 90 degree four radial meshing slits 32 adapted to be brought into meshing engagement with the meshing pins 31.

If the above Maltase gear mechanism is provided with four meshing pins with an angular interval of 90 degree, it becomes a conventional Maltase gear mechanism. In this conventional mechanism, revolutions of shaft of the driving wheel $A_a$ are transmitted stepwise through angles of 90 degree. In other words, the mechanism achieves such intermittent feeding that the speed ratio changes exponentially. Thus, the revolution ratio does not change.

When the opposing two meshing pins are removed out of the four meshing pins and the remaining two pins are used as the meshing pins 31, the resulting Maltase gear mechanism will fall within the scope of this invention. In this case, each full revolution of the driving wheel $A_a$ includes two idling period, each through an angle of 90 degree. The transmission ratio of the revolution to the driven wheel $B_a$ is ½.

When many of such Maltase gear units $U_a$ are connected in a multi-stage, the higher units are intermittently driven while their revolution ratios are successively reduced ½ by ½. Furthermore, the revolution-transmitting speed increases abruptly near the center of each 90-degree range in which the gear units are driven.

This manner of transmission of revolutions of the shafts is very close to that achieved by the above-described spur gears with some of their teeth removed.

When Maltase gear units $U_a$ are solely connected in a multi-stage as depicted in FIG. 10 and all the stages are meshed together, the speed-increasing effect is transmitted while being magnified in each stage.

To avoid such magnification, other gear units may be interposed in the same manner as in the first embodiment. Namely, the magnification of the rotary speed can be reduced by interposing between each two Maltase gear units $U_a$ another gear unit which can reduce each of the revolution ratio and the speed ratio to ½.

The above-mentioned gear unit capable of reducing the speed ratio corresponds to the second driven wheel of the gear unit U in the first embodiment.

Incidentally, cam-like, arcuate, convex surfaces 33 formed at the side of the meshing pins 31 of the driving wheel $A_a$ of the Maltase gear unit U are brought into abutment against arcuate concave surfaces 34 formed between the meshing slits of the driven wheel $B_a$, whereby inhibiting free rotation of the driven wheel $B_a$ while the driving wheel $A_a$ is idling. On the other hand, arcuate concave surfaces 35 between the arcuate convex surfaces 33 serve as relieves for tip portions of the driven wheel $B_a$, which tip portions define the meshing slots 32 respectively.

On the other hand, 1-bit encoders composed respectively of the encoder plates $E_0$–$E_{13}$ and photocouplers $F_0$–$F_{13}$ shown in FIG. 1 output a Gray binary code of 14 bits in total, corresponding to the places of the digits of the gear shafts $S_0$–$S_{13}$.

However, when one quantized unit is set equal to a single full revolution of the power input shaft, the gear shaft $S_1$ of the first stage corresponds to a bit of a single full revolution. Therefore, it is possible to measure $2^{13} = 8192$ revolutions by a 13-bit binary code. As a matter of fact, the 13-bit binary code has an effectively-measurable revolutions of $2^{14} = 16384$, including the bit of the lowest ½ revolution.

As another advantageous effect of this invention, the resolution required for the encoder in the worst case is set at a constant value, for example, at 45 degree as mentioned above. Theoretically speaking, it is thus possible to obtain an encoder having an infinite bit number.

However, it is actually necessary to increase each input torque as the number of stages increases, because there are resistances produced by the gear shafts, resistances developed due to mismatching of the meshing engagement of the gears, etc. However, it is still possible to fabricate with ease practical encoders of up to 20 bits by usual machining accuracy.

Since the encoders coupled respectively to the gear shafts $S_0$–$S_{13}$ may be of considerably low resolution, it is possible to use reflective photoelectric switches, electromagnetic contactless switches, high-frequency contactless switches or reed switches, besides the cutoff photoelectric switches composed of the encoder plates $E_0$–$E_{13}$ and photocouplers $F_0$–$F_{13}$ in the above embodiments. Needless to say, microswitches or contact switches may be used equally.

As another example of application of cutoff photoelectric switches, two-way lines of optical fibers are used as feed lines of data and the butting of the two-way lines of optical fibers is established at the photoelectric transducers $f_1, f_2$ of the photocouplers F in FIG. 1. This provides a high-standard explosion-proof encoder having no electrical wiring. It may advantageously be used for controlling the opening/closure of valves in chemical plants or the like.

Having now fully described the invention, it will be apparent to one of ordinary skill in the art that many changes and modifications can be made thereto without departing from the spirit or scope of the invention as set forth herein.

What is claimed is:

1. A compact rotary encoder including encoders, gear shafts and a train of gears, each having teeth meshed together in a multi-stage arrangement, each stage comprising a driving wheel, a driven wheel, and a second driven wheel so as to successively reduce rotation of later stages, the encoders are provided with the gear shafts at desired stages in order to count revolutions of a power input shaft, said driving and driven wheels being spur gears, wherein the driving spur gear and its corresponding driven spur gear, between each desired stages of the train of gears, form an intermittent feed means permitting idling of said driving spur gear and reducing rotation between desired stages, characterized in that:

the number of teeth of said driving spur gear is 16 and the number of teeth of said driven spur gear is 8, the teeth of said driving spur gear are removed except for two teeth adjacent each other and another two mutually-adjacent teeth which are diametrically opposite the two adjacent teeth, wherein said intermittent feed means has a gear ratio of 4:8 so as to achieve a revolution reduction ratio of ½ and said encoders are one-bit encoders mounted on end portions of each of said gear shafts of the respective stages of the train of gears.

2. A rotary encoder as claimed in claim 1, wherein a rib having a radius equal to the height of the teeth of the driving spur gear is provided on a rear side of the teeth of the driving spur gear and extending substantially around the spur gear with only the space between the two pairs of mutually adjacent teeth remaining open, every other tooth of the driven spur gear has a tooth thickness partially recessed to about half the thickness of every other tooth, wherein only the partially recessed teeth can overlap the rib while teeth adjacent the partially recessed teeth abut against the rib to lock the driven spur gear while the driving spur gear is being idled.

3. A rotary encoder as claimed in claim 1, wherein the one bit encoder corresponding to each gear shaft comprises an encoder plate defining a cut-off part having a suitable angle and a photocoupler.

4. A rotary encoder as claimed in claim 1, wherein the one-bit encoder corresponding to each gear shaft comprises of an encoder plate defining a cut-off part having a suitable angle and an optical fiber adapted to be brought into abutment with the encoder plate so as to connectably cut off the optical path thereof.

5. A rotary encoder as claimed in claim 1, wherein the gear shafts of the train of gears meshed in the multistage are arranged in a circular pattern about the power input shaft.

6. A rotary encoder as claimed in claim 2, wherein the one bit encoder corresponding to each gear shaft comprises an encoder plate defining a cut-off part having a suitable angle and a photocoupler.

7. A rotary encoder as claimed in claim 2, wherein the one-bit encoder corresponding to each gear shaft comprises of an encoder plate defining a cut-off part having a suitable angle and an optical fiber adapted to be brought into abutment with the encoder plate so as to connectably cut off the optical path thereof.

8. A rotary encoder as claimed in claim 2, wherein the gear shafts of the train of gears meshed in the multistage are arranged in a circular pattern about the power input shaft.

9. A rotary encoder as claimed in claim 3, wherein the gear shafts of the train of gears meshed in the multistage are arranged in a circular pattern about the power input shaft.

* * * * *